US005482568A

United States Patent [19]
Hockaday

[11] Patent Number: 5,482,568
[45] Date of Patent: Jan. 9, 1996

[54] MICRO MIRROR PHOTOVOLTAIC CELLS

[76] Inventor: Robert G. Hockaday, 3025 Arizona Ave., Los Alamos, N.M. 87544

[21] Appl. No.: 266,625

[22] Filed: Jun. 28, 1994

[51] Int. Cl.$^6$ ............................ H01L 31/052; H01L 31/18
[52] U.S. Cl. ............................. 136/246; 136/206; 437/2; 437/51
[58] Field of Search ........................... 136/206, 246; 437/2–5, 51; 156/628, 644, 668

[56] References Cited

U.S. PATENT DOCUMENTS

| | | | |
|---|---|---|---|
| 3,229,682 | 1/1966 | Perlmutter et al. | 126/698 |
| 3,977,904 | 8/1976 | Köhler | 136/246 |
| 4,099,515 | 7/1978 | Schertz | 126/661 |
| 4,191,593 | 3/1980 | Cacheux | 136/259 |
| 4,200,472 | 4/1980 | Chappell et al. | 136/246 |
| 4,200,472 | 4/1980 | Chappell et al. | 136/246 |
| 4,638,110 | 1/1987 | Erbert | 136/246 |
| 4,834,805 | 3/1989 | Erbert | 136/246 |
| 5,081,049 | 1/1992 | Green et al. | 437/2 |
| 5,091,018 | 2/1992 | Fraas et al. | 136/246 |
| 5,100,478 | 3/1992 | Kawabata | 136/249 |
| 5,156,978 | 10/1992 | Bathey et al. | 437/2 |
| 5,192,400 | 3/1993 | Parker et al. | 205/124 |

FOREIGN PATENT DOCUMENTS

| | | | |
|---|---|---|---|
| 1-57681 | 3/1989 | Japan | 136/246 |
| 3206669 | 9/1991 | Japan | 136/256 |

OTHER PUBLICATIONS

Werner et al, "Thin Single–Layer Silicon Solar Cell Achieves Greater Than 14% Efficiency", Laser Focus World, Jul. 1993, p. 13.

Treble, Fred C. Editor, "Generating Electricity From the Sun", Pergamon Press, Pergamon Press 1991, pp. 177–199.

Micro–Optics Become Nano–Optics, at 16. Publication Name/date unknown.

Winston et al., "Retinal Cone Receptor as an Ideal Light Collector", Aug. 1971. Publication Name Unknown.

Trotter, D., "Photo Chromic and Photo Sensitive Glass", Scientific American, Apr. 1991, at p. 124.

Ceglio, N. M., "Revolution in X-Ray Optics", Journal of X-Ray Science and Technology, vol. 1, No. 1, Jul. 1989, at p. 7.

E. L. Ralph, *Conference Record, IEEE Photovoltaic Specialists Conf.* (1970), pp. 326–330.

*Primary Examiner*—Aaron Weisstuch
*Attorney, Agent, or Firm*—James Creighton Wray

[57] ABSTRACT

A photovoltaic concentrator module has miniature concentrating mirrors and photovoltaic cells attached to each mirror. A matrix of small thin mirror substrates are formed by coating a preferentially etched irradiation damaged dielectric substrate with a dielectric film, and etching away the dielectric substrate. The mirror substrates are coated with a reflective metal film to form the collecting optics and first electrode. The photovoltaic cells are formed by preferentially filling the mirror with semiconductor material and metal coating on top of the semiconductor for the second electrode. The mirror cone geometry is useful in preferentially locating material deposits. In the mirror dimensional range of 1 cm to 10 nm the optimization of the mirror photovoltaic cell is expected to occur, resulting in more efficient cooling, interconnections, material utilization, and shunt fault elimination.

41 Claims, 4 Drawing Sheets

MICRO MIRROR PHOTOVOLTAIC CELLS

BACKGROUND OF THE INVENTION

This invention relates to electrical power generation using mirror photon concentrators, specifically in advantageous size ranges and methods of making the devices. This invention also describes the forming of a plurality of small mirrors.

Prior attempts to make photovoltaic devices which produce electrical power from high intensities of photons have had problems with economic success. That has been due to a number of disadvantages.

Large amounts of expensive semiconductor material are typically required to manufacture state-of-the-art photovoltaic devices to convert photons to electricity. Those materials are expensive and thus lead to expensive photovoltaic devices.

The manufacturing methods used in the past had a large number of mechanical steps and were inefficient, such as forming classic crystalline silicon cells. In that process photovoltaic arrays were formed from sliced wafers, from a silicon crystal boole and in subsequent processing steps. In that process approximately 80% of the semiconductor was turned into dust and was recycled, and there were many mechanical operations. The increased number of mechanical operations needed to manufacture something typically drives up the cost of the product and reduces the reliability.

Locating an aperture and a semiconductor on the smooth back plane of an assembly with lasers limits the methods and materials that can be used. Many promising semiconductor materials are not amenable to processing by laser heating. Short thermal cycles, contact with surrounding materials, or extreme temperature gradients during semiconductor crystallization could present problems in obtaining optimum electrical properties.

The laser power needed to form the solar cells rises as the cells become smaller because of the increased cooling efficiency as the dimensions get smaller.

Suitable lens materials may not have the mechanical properties needed for the tasks compared to thin film mirrors, such as in processes or applications where the array would ideally be rolled up. Most inorganic optical materials are brittle and many plastic materials will optically degrade with long exposure to UV light.

In a lens-concentrating photovoltaic system components are mechanically assembled. Parts of the structural system are fresnel lenses and frames. That adds significant volume and mass to the system.

Thin single-layer silicon solar cells have been reported to be efficient because carrier diffusion length is an order of magnitude longer than the cell is thick, providing high open circuit voltages.

Solar cells formed with spherical silicon and connections to the silicon spheres provide cost advantages over slices of a single crystal or vapor-deposited semiconductors, because semiconductor spheres can be formed without interaction with the surrounding materials.

Fault tolerance in typical thin-film photovoltaic cells is poor; reduced performance and even catastrophic cascade failures occur with faults. State-of-the-art photovoltaic cells require metal conductor connections that are significant parts of the mass. They are often formed in separate steps. Shorting liability results from the amount of metal used to keep the resistance losses low. Large metal conductors allow large arcs to form and thus damage large areas around the arc, or even weld sufficient metal to short-circuit the entire photovoltaic array.

Needs exist for improved photon collectors and photovoltaic cells.

SUMMARY OF THE INVENTION

Weight is greatly reduced with this invention. Improved efficiency and semiconductor utilization is achieved by using thin films with light tapping, and optimized electrodes.

High volume production and reduced manufacturing costs result. Optics are manufactured using etched mirrors, stamped mirrors or molded mirrors. The mirror cone relief geometry and aperture geometry allow a variety of techniques to be used to form the discreet aligned photovoltaic cells as contrasted with using the lasers to locate the semiconductor.

The present invention is applicable to a wide variety of photovoltaic cell types and cell substances. This invention is also applicable to thermopiles, electromagnetic resonators/ rectifiers, and thermionic energy converters.

Components of photovoltaic cells using this invention serve multiple functions. The mirror structure is also the semiconductor mount and the electrodes. The mirror and the insulators are also the structural support system. The needle-like shapes of the mirror electrodes and small contact areas are useful in reducing the electron recombination currents.

Small concentrators coupled to small photovoltaic cells have several dimensional scaling advantages over larger concentrators. Principally, the small dimensions of the concentrating optics and photovoltaic cell give the system advantages of efficient cooling, higher efficiencies, higher utilization of semiconductor material, lowered manufacturing costs, non-shadowing of electrodes, easier manufacturing methods, and shorter average electrical path lengths. Improved optical registration of the deposited semiconductor and doping permits annealing of the semiconductor with focused intense laser light, permits the interweaving of the electrodes to make series connections, permits plastic or glass lenses for the support structure, decreases the volume of the modules, and reduces the module weight with the smaller optic dimensions.

Lenses used for focusing light can be a large fraction of the total system weight. Low system weight can be a critical factor in space applications. The cost and steps of using lasers to form cells could be a major cost consideration when trying to minimize manufacturing costs.

The costs of forming optics at the 10 to 100 micron entrance diameter optics level, where micro concentrator schemes tend to optimize for weight, cost reduction and optical trapping considerations, may go up as the dimensions get smaller. Micro lenses simply may be a more expensive method of forming concentrating optics compared to micro-mirrors.

Light trapping leads to significant improvements in efficiency and utilization of semiconductor material. Trapping is effective when the semiconductor thickness is thinner than the photon absorption length.

Small electrode size provides geometric advantages for reducing recombination currents. Small separated cells have intrinsic fusing properties.

Refracting materials have the disadvantage of filtering out desirable portions of the electromagnetic spectrum or degrade transmissivity with effects that do not affect mirrors, such as by UV radiation damage.

Thin material absorbs less light unless a light-trapping technique is used. To increase the cell efficiencies beyond 20%, light-trapping anti-reflective coatings are used. Light-trapping coatings have been suggested, but how to form the light-trapping apparatus has not been described.

A reflection cavity can improve the efficiency of thin cells by trapping light with a mirrored cavity. How to manufacture the reflection cavity is taught by this invention.

Fault tolerance in devices using this invention is excellent due to the inherent small size of components and their separation on top of insulating material, which inherently makes them fuses. By having a large fraction of the device made of electrically insulating material the system has a property of having the short circuit arcs blowing out to open circuits.

With thin film perforated substrates, both sides of the system can be physically accessed during manufacturing. Double-sided circuits and small path length series circuits can be formed integrally with the cell. That minimizes the current loads the thin film metal conductors need to carry. This advantage allows thin metal films to carry the output power of the cells and keeps the metal-to-insulator content ratio low, thus maintaining good fusing characteristics. Resistance losses are minimized and the fraction of metallic conductors to the cells' mass is minimized.

A photovoltaic concentrator module is constructed of miniature concentrating mirrors and photovoltaic cells attached individually to each mirror. A matrix of small thin mirror substrates is formed by coating a preferentially etched irradiation damaged dielectric substrate with a dielectric film, and etching away the dielectric substrate. The mirror substrates are coated with a reflective metal film to form collecting optics and the first electrodes. Photovoltaic cells are formed by preferentially filling the mirror cavities with semiconductor material. A metal coating on top of the semiconductor material forms the second electrode. The mirror cone geometry is useful in preferentially locating material deposits. With respect to materials use, costs, reliability and efficiency, forming the optics and the photovoltaic cells in the dimensional range of 1 cm to 10 nm optimizes the performance of the photovoltaic cells. That optimization occurs at small dimensions because of several factors of efficient cooling, reduced material usage due to concentration, light trapping, compact structure, multiple use of individual components, separation between the cells, high insulator-to-metal content volume ratio of the system, small mass per unit area, microscopic high dimensional stiffness, materials substitution for the support matrix, small average current loads, interleaving of thin film electrical contacts, dimensional advantages of small electrical contacts, and simple and efficient manufacturing. Those factors permit the use of cheaper and lighter materials and lead to reduced material usage and higher specific power per unit mass and reduced operating temperatures, permit high volume continuous manufacturing techniques, reduced temperature-induced efficiency losses, reduced radiation damage sensitivity, reduced electrode and recombination losses and increased efficiency, among various other benefits. Other types of converters that can be formed using the techniques of this invention are thermoelectric junctions, electromagnetic resonators/rectifiers, and thermionic devices.

These and further and other objects and features of the invention are apparent in the disclosure, which includes the above and ongoing written specification, with the claims and the drawings.

DETAILED DESCRIPTION OF THE DRAWINGS

Figure 1:
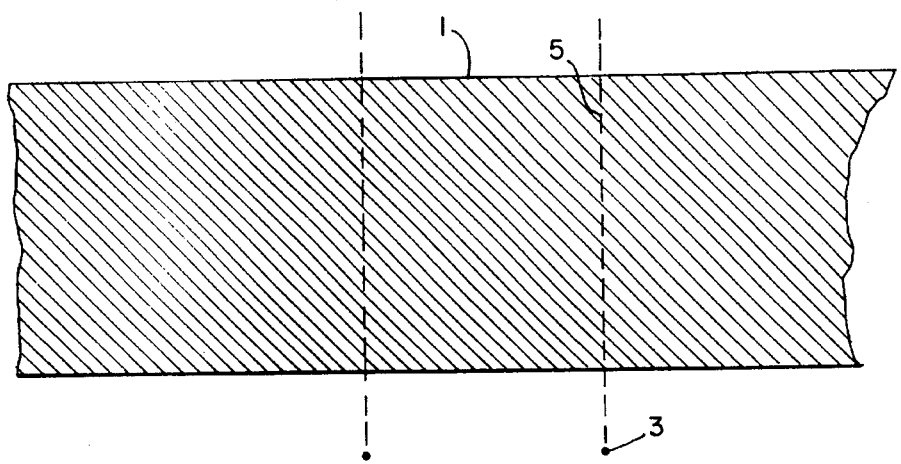
FIG. 1 schematically shows irradiating of the dielectric film.

A typical embodiment of this invention is illustrated in the following figures showing steps to form high power per unit mass elements. Subsequent variations to handle different applications or material properties may be made. The figures are not drawn to scale for clarity, since actual ratios of some dimensions can be thousands of times that of other dimensions. The cross-sections are through the centers of cylindrically symmetric shapes such as cones or through two-dimensional shapes such as troughs into the plane of the page. It should be noted that the mirrors show flat spaces between their entrances, which was done for clarity in the drawings. For maximum through-put the mirrors should be adjoining and the outer surface would look like thin sharp ridges where the mirrors intersect. The mirror concentrators may have optical shapes such as cylinders, cones, parabolas, ellipses, hyperbolas or non-imaging, that are optimum shapes for concentrating light to the exit apertures. In preferred embodiments lenses may be coupled with the mirror concentrators. The exit apertures may have dimensions less than 2 mm. An assembly may be formed by attaching the mirrors and cells to a rigid substrate and having the attached mirrors and cells encapsulated in a clear material.

FIG. 1 shows the forming of the mirror substrates in a dielectric film 1 with charged particles, X-rays or UV light. The irradiation source 3 can be controlled to form a regular array of damage tracks 5 in the dielectric film. Large interconnection holes can be prepared for by closely spacing some of the damage tracks in the desired areas. A thin polycarbonate film is a suitable substrate 1.

Figure 2:
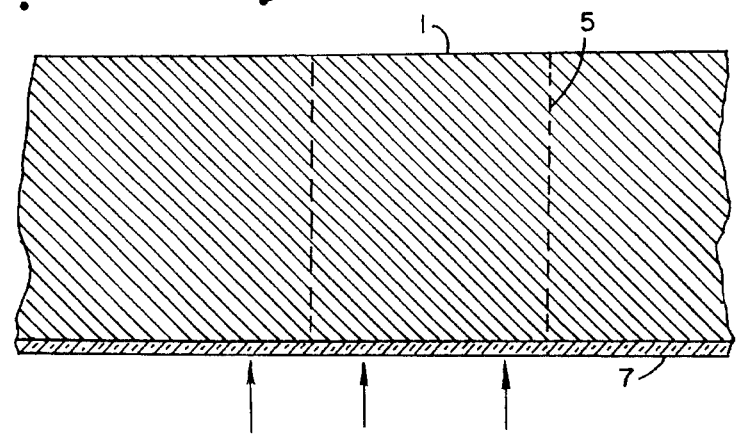
FIG. 2 shows the coating of the back surface with an etch barrier.

FIG. 2 shows the coating of the back surface of the irradiated film 1 with an etch barrier film 7. A barrier film such as plasma polymerized TEFLON film or paraffin is suitable.

Figure 3:
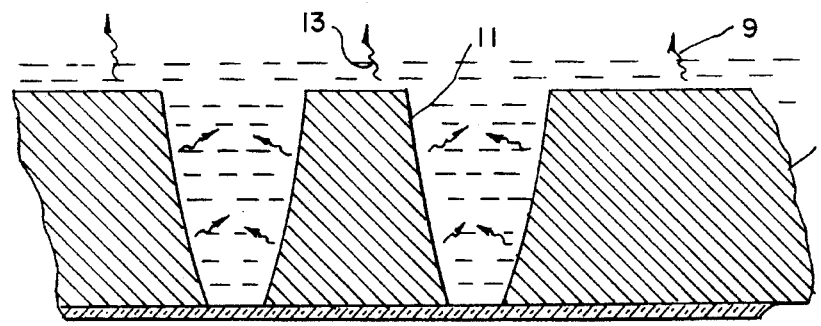
FIG. 3 illustrates the etching of the damage tracks with a time varied temperature etch.

In FIG. 3 the film is etched with a time varied temperature etch bath 9 to form the desired figured surfaces 11. A suitable etch solution is concentrated NaOH and water solution. The small arrows 13 shows the etching away of the substrate 1.

Figure 4:
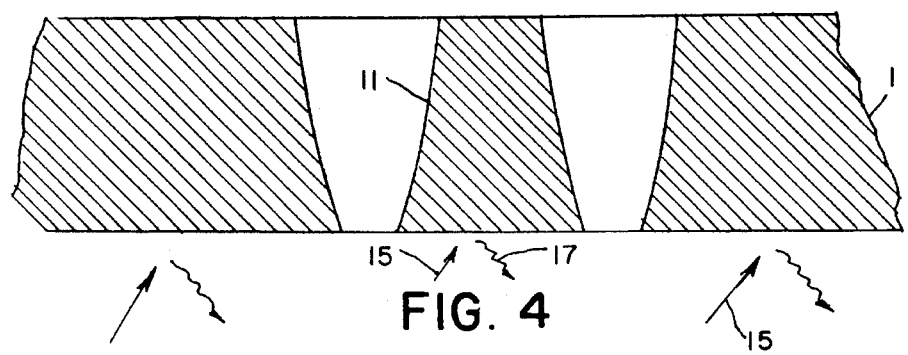
FIG. 4 shows the removing of the etch barrier film.

FIG. 4 shows the etch barrier film removed, such as by irradiation 15 for TEFLON or by evaporation 17 of paraffin.

Figure 5:
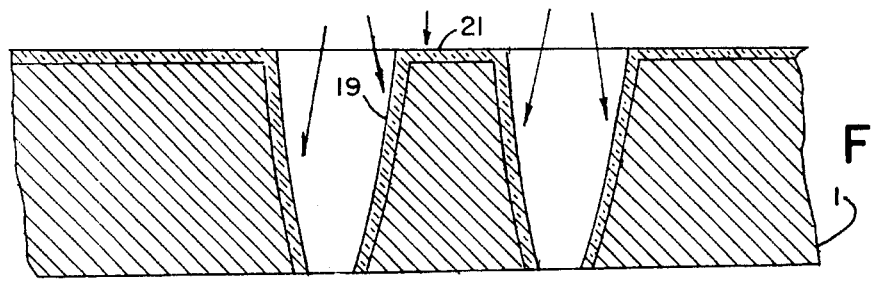
FIG. 5 shows the coating of the surface of the figured optical surface with an insulating film.

In FIG. 5 the mirror substrates 19 are formed by vapor depositing a dielectric insulator film material 21 such as (poly p-xylylene: $C_8H_8$) over the dielectric mirror substrate.

Figure 6:
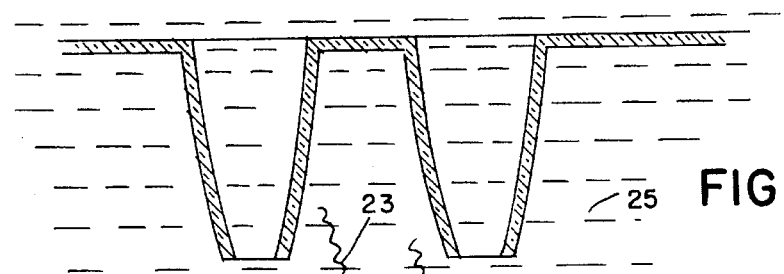
FIG. 6 shows the removing of the dielectric substrate.

In FIG. 6 the substrate is etched away 23. A partial etch away can be done if retaining some of the substrate is useful structurally. Suitable etchants are NaOH solutions 25 or dry chemical etchants.

Figure 7:
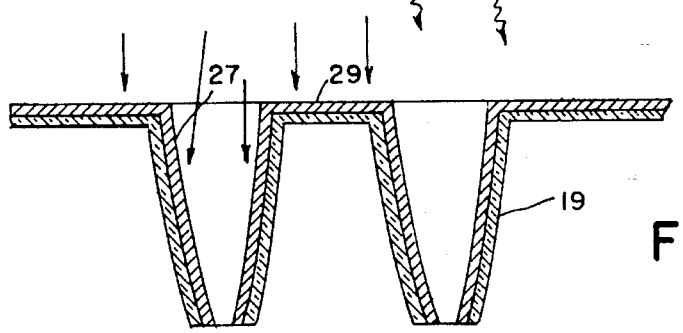
FIG. 7 illustrates the deposition of the front electrode.

In FIG. 7 the insulator film mirror substrates are coated with metal reflective films 27 and front surface electrodes 29. An example of a suitable material is evaporated aluminum. This coating can be selectively shadow masked to provide for cell separations and series connections.

Figure 8A:
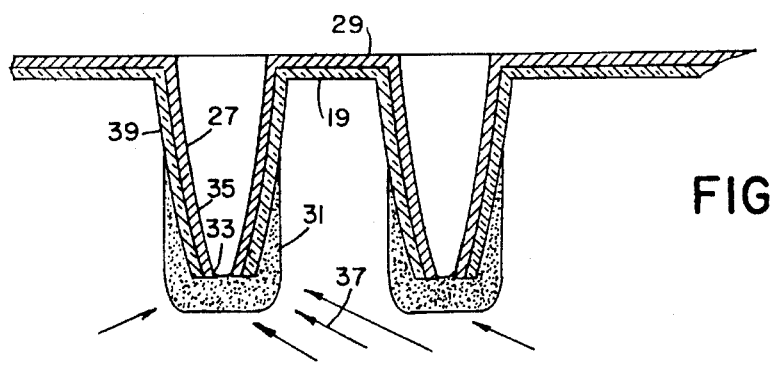
FIG. 8a shows preferential semiconductor deposition.

FIG. 8a shows preferentially depositing semiconductor material 31 about the exits 33 of the mirrors 35 such as with low grazing angle of incidence vacuum vapor deposition 37. Shadowed surfaces 39 receive little or no coating. An example of material suited to this method is sputter deposited doped amorphous silicon and sputter deposited p type doped amorphous silicon. The deposited semiconductor thickness needs to be sufficient to cover the exits of the micro mirrors where the cells are to be formed.

Figure 8B:
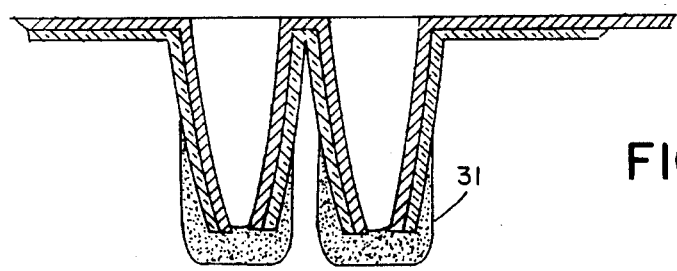
FIG. 8b shows the mirrors close to each other.

FIG. 8b shows the mirrors 35 adjacent to each other.

Figure 9:
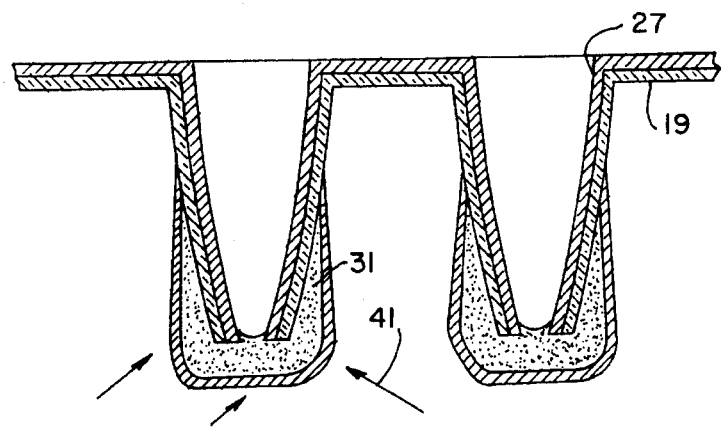
FIG. 9 shows the dopant deposition.

In FIG. 9 the back side of the Si semiconductor 31 is doped with an n type dopant 41.

Figure 10:
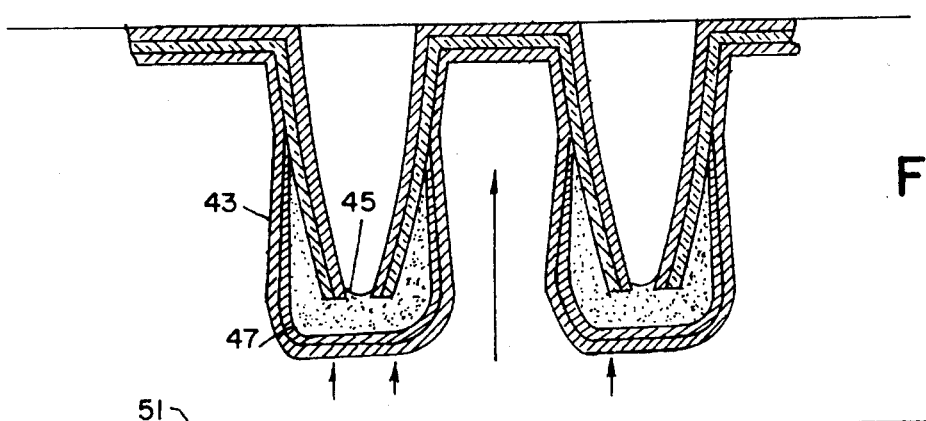
FIG. 10 shows the deposition of the back electrode.

FIG. 10 shows vacuum vapor deposition of a reflective silver electrode 43 on the back sides of the silicon semiconductors 31 and the substrate 19. The connections between the cells are made with this step by coating through the larger still-open holes. Separations between the cells are made by masking off regions between the cells. With the addition of the back reflective electrode 43 about the semiconductors 31, the photon traps are formed with entrance aperture areas 45 being a small fraction of the semiconductor surface area 47.

Figure 11:
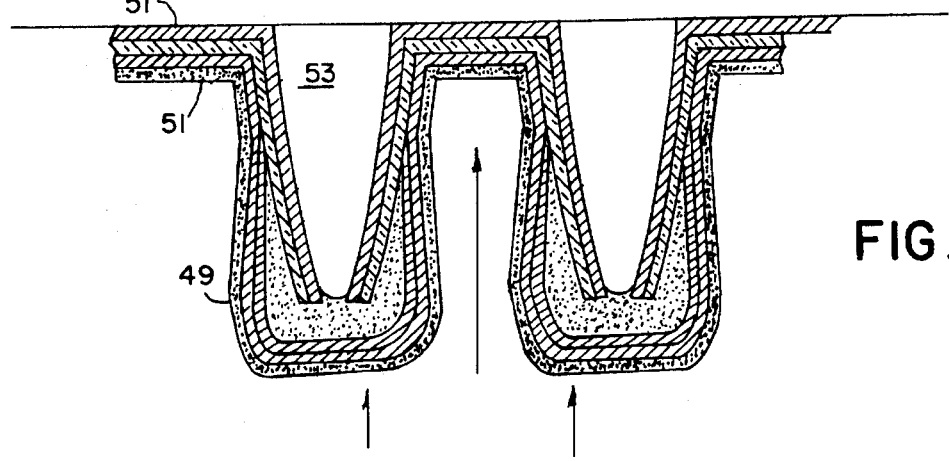
FIG. 11 shows coating of the back electrode for high emissivity and environmental protection.

In FIG. 11 a blackening coating 49, such as graphite carbon particles or film, is deposited on the back side of the cells to give a high emissivity for efficient radiant cooling in vacuum. Metal film 27 used as a mask 51 to separate the cells 53 is still in place to keep the cell electrical separations clean. For terrestrial cells this step could be a back sealing step using a black insulating coating to seal the cells from corrosion.

Figure 12:
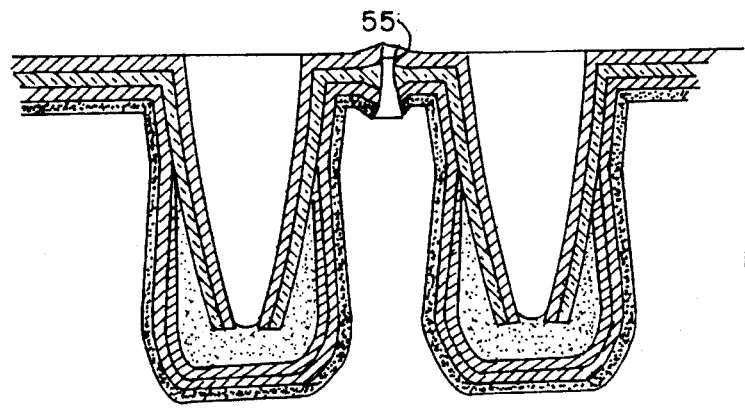
FIG. 12 illustrates burning in of the completed cells.

As shown in FIG. 12, to ferret out low resistance semiconductors or shorts it is possible to vaporize or melt point failures 55 by externally applying high voltages to the system or simply running it with high light intensities and open circuited.

Figure 13:
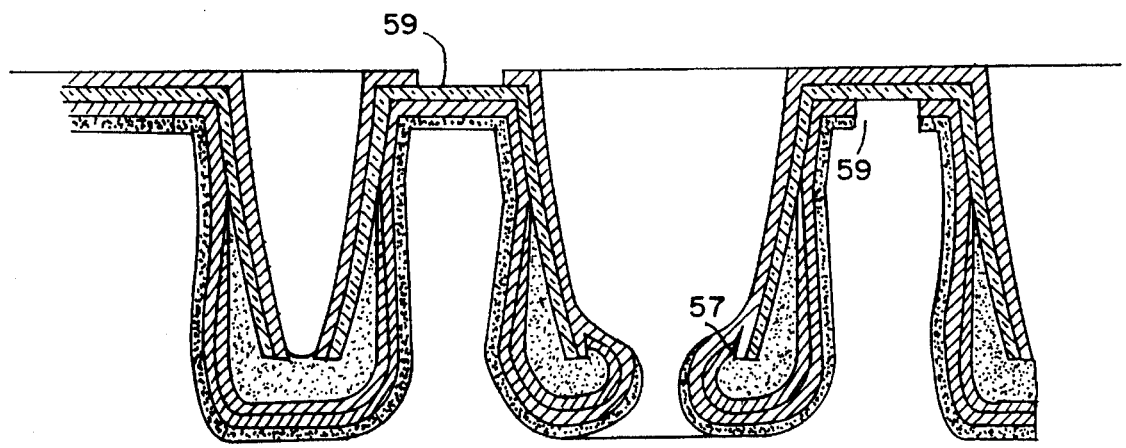
FIG. 13 is a cross-sectional view of the through film interconnections to allow series connections of cells.

FIG. 13 shows a way of interconnecting the cells 53 through the insulator film by using larger through holes 57 to make the interconnections. Electrode breaks 59 would be placed on the front and back side on either side of the through connection as shown in FIG. 13.

Figure 14:
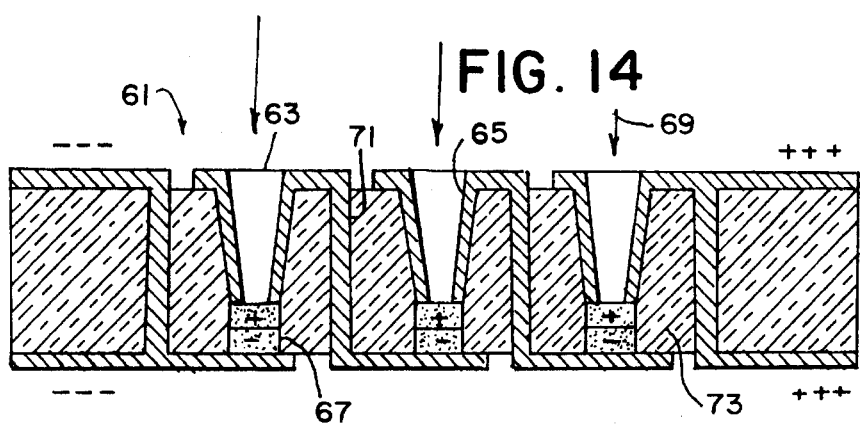
FIG. 14 is a cross-sectional schematic representation of the interwoven electrical series circuit.

FIG. 14 is a schematic representation of an array 61 of micro mirror 65 photovoltaic diodes 67. Photons 69 are shown entering the diodes. Each diode generates an electrical potential and current. The cells 63, or arrays 61 of cells, are connected 71 in series through the insulator film 73.

Several variations can be made for different applications or material properties. Variations and deviations can be made from the basic design as previously described.

Dielectric filled mirrors may be formed instead of hollow mirrors. Initial steps include damage track etching, stamping, grinding, extruding or molding the dielectric material. When using filled mirrors, a step of clearing off the mirror film would be added, such as by grinding, laser ablating or ion milling. Also, due to access to only one side of the system, the electrodes could be either not in series or in a series of offset films to form cells in series. The reflective surfaces would be metal coatings or low to high index of refraction interface coatings.

When the mirrors are formed by stamping metal foil, an insulator film is deposited on the back side of the metal film.

In the irradiation step macroscopic patterns can be formed with exact control with charged particles, UV or X-ray beams. These track patterns, once they are etched, put relief structures in the thin film that reduce or eliminate the need for shadow masks to separate cells.

Vacuum deposition of a metal "jumper" contact on the back side of the mirror insulator assembly insures contact with the back film after the semiconductor deposition step.

An electrically insulating layer is put down before the metal film, which is a more suitable insulator for the weld step and a better insulator separator for the back contact step.

Other methods of deposition rather than vacuum vapor deposition may optimize the deposition locations of the semiconductor by using such techniques as electrostatic attraction to the conducting mirror tips, masking, condensation onto the cooled mirror tips, preferential condensation, and chemical vapor deposition crystallization seed growth on the mirror tips.

Particulates of semiconductor material could be deposited by filtration of a gas or liquid fluid suspension of the semiconductor to lodge the semiconductor particles into the mirror exits. Other methods of delivering the particles to just the mirror exits are using electrostatic attraction to the mirror metal tips, or having the semiconductors be hot and sticking them to the mirror tips with particles randomly bounced onto the metal tips. A section of the surface must be masked to keep the metal contacts open to later form the metal connections with the other cells.

The semiconductor can be flash heated in vacuum with electromagnetic radiation to weld and anneal the contact with the semiconductor. This step could also allow the mirror metal diffusion doping into the semiconductor. This step should also hide the mirror metal contacts from direct contact with the back electrode by pressing back the insulator or mirror metal shrinking back up upon welding and annealing. This step depends on the optics focusing light to the semiconductor and the semiconductor preferentially absorbing the light. The semiconductor subsequently in vacuum will heat and weld to the metal contacts. In vacuum the low thermal contact semiconductor particulates will become much hotter than the welded semiconductor particulates. Thus the tendency will be to weld all the non-contacted semiconductors, and to have no further effect on particulates in good thermal and electrical contact. Once a weld is started it terminates with the exhaustion of thermal capacity of semiconductor particulate and the metal mirror. Forming electrical contacts of small contact area may be critical for cell efficiency; thus the transient thermal limit is important.

The step of flash heating could also be combined with the delivery of particles by pre-heating the particles and electrostatically attracting them to the mirror tips. Upon contact with the mirrors the semiconductor would weld. Another variation is to heat the approaching semiconductor particles with light concentrated through the mirror and have the particles weld when they make contact with the mirror tip.

To form a highly reflective back electrode and keep the contact area small, it may be advantageous to deposit a thin low index of refraction film about the semiconductor, before the metal film, then to form a small point metal contact hole by selective material removal such as by ion milling, and then deposit the back metal electrode.

Before the back contact is made, an additional step may insure there are no loose electrical contacts. An insulating film may be deposited and then removed-from just the outer surface of the semiconductor, or by anodizing the mirror film the mirror film could be sealed. In both cases the semiconductor contact is cleared off for the back electrode contact after that step. If ion milling is used, it could also be a step in doping the semiconductor.

Photons enter the micro mirror 27 and are concentrated to the exit aperture 33 of the mirror. The photons enter the semiconductor 31 and create electron hole pairs which are then separated by the P/N semiconductor junction 31, 41 field and transported to the respective electrodes. One of the electrodes is the micro mirror 27 and the other is the back electrode contact 43. Photons that are not absorbed are reflected off the back electrode 43 and travel back toward the entrance aperture 33 with further absorption occurring. Due to the small aperture 33 size compared to the semiconductor 31 surface area, a small fraction of the reflected photons can escape back out through the micro mirror 27. The non-escaping photons are reflected by the back side of the micro mirror 27 and the process is repeated, eventually absorbing the photons or allowing them to escape. The electrons and holes collected at the electrodes 27, 43 create a potential difference between the electrodes which is connected to an electrical load and does useful work when the current flows and recombines the electrons and holes. Excess heat from the photon energy conversion inefficiencies is conducted away from the semiconductor 31 through the back electrode 43, insulator 19, and front electrode 27. The heat is then conducted to the surroundings or radiated off the back surface coating 49.

If a short 55 occurs, either due to a manufacturing defect or a mechanical breakage, the subsequent electrical discharge heats up the dielectric 19 and metal films 27, 43 until it expands, melts or vaporizes. That expansion, melting or vaporization separates the electrical contact 55 and the undamaged portions of the array can then return to normal operation.

In photovoltaic devices concentrating the photons to reduce the amount of expensive semiconductor material is highly advantageous. A major problem with past concentration is that the higher concentration also led to higher heat loads and higher temperatures in the semiconductors. The efficiency of the semiconductors is usually degraded by operating at elevated temperatures. That overheating problem has been usually solved by using a conductive heat sink to distribute the heat flow to the back side of the solar cell system. For silicon solar cells, the conduction rates through copper heat sinks and centimeter size solar cells limits their concentration. Advantages of the past conventional concentrator systems over non-concentrating systems had to account for the increased costs due to the concentrating optics and the heat sink system.

Temperatures at the focuses of mirrors focused onto a sheet of material are roughly proportional to the dimensions of the focusing mirror. An explanation of that concept is to think of concentrating a uniform intensity of sunlight into hot spots and then to remove the heat and distribute it into the areas between the hot spots. If the hot spots are made more numerous, the power through each hot spot is divided by the number of hot spots. The average distance the heat has to flow to spread itself evenly out over the total area of the system is proportional to the distance between the hot spots. The temperature rise needed to drive the heat from the hot spots is proportional to the distance the heat has to be driven. Thus, the temperature rise of each hot spot is proportional to each hot spot's territorial dimension. To keep the temperatures low, the optics are small.

The amount of material used in the collecting optics system per unit area is proportional to the dimensions of the optics. Unique scaling relationships are obtained. The mass of an optical device required to maintain its shape scales as the cube of its dimensions. The power received by the optic scales as the square of its dimensions. The amount of material needed to construct the optics for a given output is proportional to the optics' dimensions. There is a limit to how small the optics usefully can be made; that is the diffraction wavelength limits of light. An optimum dimension for concentrating optics balances the total mass and costs of the system against the wavelength diffraction limits of light.

In many of the photovoltaic cells the mean free path of the photons is large compared to the mean free path of the minority carrier path length, as in the case with silicon solar cells. If a silicon photovoltaic cell's electrical characteristics are optimized, a large fraction of the incident photons will not be absorbed by the cell. Consequently, low overall energy efficiency results. With light trapping, electrical characteristics and photon capture efficiency can both be maximized. Micro concentrators can optimize solar cell performance by reducing the shadowing of electrodes and reducing the resistance losses. However, practical implementation heretofore has remained problematic.

Solar technology often is directed toward larger devices for easier manufacturing with fewer connections. That is the trend with state-of-the-art concentrating solar cells. However, the best solution for optimum cell performance and lower material costs is in the opposite direction, i.e. smaller and optimum dimensions.

Two other ancillary physical properties result from forming small separated cells through a thin insulating substrate. A natural fusing system is formed, and the system is macroscopically flexible.

The fusing is due to thermal dimensional scaling properties of the small separated diodes and arc blowout when the insulator-to-metal and semiconductor content is high. A fuse exists in a geometry of a metallic conductor making electrical contact through an insulator film with metal films on either side of the insulator. The temperature rise that can be reached is roughly proportional to the voltage squared and the radius of the fuse and is inversely proportional to the thicknesses of the insulator and the metal films. From those relationships, the fuses have the following three properties. The first property is that shorts of small dimensions, with small radius or large insulator and metal thicknesses, efficiently dissipate the ohmic heating and do not cause any of the system components to melt. Although the small shorts represent an electrical loss, the small shorts do not individually drag down the electrical potential of the system. The second property is that keeping the system's insulator-to-metal ratio high and each individual cell separated stops catastrophic discharge radius growth failure. That type of electrical failure could be expected in a conventional solar cell where the metal contacts are separated by a semiconductor plane. If the radius of the short is large enough so that it can enlarge when it heats the semiconductor, that will lead to a dramatically increasing discharge power as the short radius grows, and hence a runaway condition. That runaway condition will either arc until it blows off the metal contacts or shorts down the electrical power source. The third property is that, with the temperature rise proportional to the square of the voltage, small shorts are melted or vaporized with a moderate increase in voltage across the cell. The small shorts or defective cells, although they will not "fuse" at operational voltages, represent a drain on the current output of the system. By raising the voltage across the cells, it is possible to vaporize or melt back the metal from the cells that have a short larger than a certain radius or low resistance. That "burning in" of the system ferrets out defective semiconductors and shorted connections. Those properties of designed defect tolerance and correction allow a system of massively parallel cells to tolerate a fraction of the cells being defective or having local mechanical damage.

The second ancillary property is that, by making the light collectors and the individual cells small, the system is flexible on a macroscopic scale. The metal, semiconductor, and insulator parts tolerance for expansion coefficient stresses to bending are proportional to the dimensions of the components. By forming the system of cells into a thin sheet of cells, the system can be rolled for ease in manufacturing, shipping, handling, and dense storage.

By forming photovoltaic cells by making contact at ends of micro cones, the needle-like geometry is beneficial in reducing the recombination currents near the electrodes. The mirrors serve-many purposes. They are the light collectors and optimum electrode geometric contacts and are part of the structural support. Other micro diode devices, thermoelectric cells, thermionic cells and resonator/rectification diodes and the geometry of the electrode contacts play a major factor in efficiency. The mirror aperture design serves also as a light trap. By focusing the light through the entrance aperture electrodes, the light enters the semiconductor. Light can also be trapped into the semiconductors by diffraction off the micro mirror electrodes. If the surface area of the semiconductor is much larger than the entrance aperture, the probability for escape of an internally reflected photon, assuming no absorption, is approximately equal to the aperture area divided by the total surface area of the semiconductor diode. There is photo absorption, but by trapping the light between two reflective electrodes the amount of semiconductor needed can be reduced. When photovoltaic devices are optically thin for the photons that are effective in generating the output currents, trapping can be very effective. Already built thin film photovoltaic cells with back reflective electrodes are improved by placing a light concentrating mirror array in front of the photovoltaic array. The mirror array should be placed further than approximately one half aperture dimension from the back surface to allow a large fraction of the light not to reflect straight back out of the aperture. The mirror array should be placed close enough to avoid having to make large side reflectors, and to avoid making a large hollow bulky system. The advantage of smaller mirrors over large mirrors is that the thickness of the mirrors and the standoff distance change with the dimensions of the mirrors is smaller. If the mirror's apertures are of an order of the thickness of the semiconductor or smaller, the mirror array can be mounted as a thin film directly onto the photovoltaic cell or its clear cover.

With concentrated sunlight, the photovoltaic cell efficiencies increase to approach theoretical efficiencies, and semiconductors are more damage tolerant. In a concentrator cell, the current density per electrode area is increased. That leads to higher current density output of the cell per unit of electrode. With higher current densities, efficiencies of the cells are increased, because internal loss currents are a smaller fraction of total output. The cells can be made thinner to reduce the resistance losses, and the cell contact can optimize the current collection. Thus, concentrator cells are more radiation defect damage tolerant than non-concentrating cells. In the concentrating cells the losses to the defect recombination currents are a much smaller fraction of the total output. Both types of cells pay the same current density loss to defects. For the concentrating cell it is a much smaller fraction of the total current density.

Those dimensional considerations lead to numerous advantages such as reduced material usage, reduced cost, increased efficiency, wide ranges of capacity, simple appearance and usage, good durability, low thermal and mechanical stress, easy manufacturing, application to a wide variety of existing power generating device types, multiple uses of internal components, better tolerance to high radiation, smaller installed volume, good fault tolerance, and efficient cooling.

The above description contains specific examples. Those should not be construed as limitations on the scope of the invention, but rather as exemplifications of preferred embodiments. Many other variations are possible. The amorphous silicon semiconductor was chosen because it is simple to describe. More optimized cells may use a variety of semiconductors and have a variety of doping processes.

While the invention has been described with reference to specific embodiments, modifications and variations of the invention may be constructed without departing from the scope of the invention, which is defined in the following claims.

I claim:

1. An electrical power generator apparatus, comprising:
   a plurality of photon mirror concentrators, wherein each said photon concentrator has an entrance aperture and an exit aperture,
   a plurality of photon converters in proximity to the exit apertures, the mirror concentrators forming first electrodes of the photon converters, an electrically insulating material on back surfaces of the first electrodes, wherein said photon converters convert energy in photons received directly or indirectly from the mirror concentrator to electrical energy.

2. The apparatus of claim 1, wherein each of the photon converters is a diode selected from the group consisting of a photovoltaic diode, a thermoelectric diode, a thermionic diode, and a rectifying diode.

3. The apparatus of claim 1, wherein the mirror concentrators are etched holes having a coating of a reflective material.

4. The apparatus of claim 1, wherein the mirror concentrators are formed by extruding, growing, cutting, grinding, molding, or stamping.

5. The apparatus of claim 1, wherein the shapes of the mirror concentrators are formed by etching damage tracks in a dielectric material.

6. The apparatus of claim 1, wherein the surfaces of the mirror concentrators are cylinders, cones, parabolas, ellipses, hyperbolas or non-imaging optical shapes that are optimum shapes for concentrating light to the exit apertures.

7. The apparatus of claim 1, wherein the surfaces of the mirror concentrators are generally grooves with light-concentrating cross-sections.

8. The apparatus of claim 1, wherein the surfaces of the mirror concentrators are replicated with dielectric coatings of etched holes in a substrate and reflective coatings on the dielectric coatings.

9. The apparatus of claim 8, wherein the geometry of abutted mirror surface replicas provides for elasticity.

10. The apparatus of claim 8, wherein the substrate is partially or fully removed.

11. The apparatus of claim 8, wherein the substrate is a dielectric thin film material.

12. The apparatus of claim 1, wherein second electrodes are deposited on the photon converters.

13. The apparatus of claim 12, wherein contact between the second electrodes and the first electrodes is controlled by the exit aperture size and the converter thickness.

14. The apparatus of claim 12, wherein the back surfaces of the second electrodes have a coating for providing desirable heat loss properties and surface protection.

15. The apparatus of claim 12 further comprising a thin dielectric coating between the photon converters and the first and second electrodes for enhancing reflections of light.

16. The apparatus of claim 12, further comprising a photon trap for trapping of photons between the first electrodes and the second electrodes.

17. The apparatus of claim 12, further comprising cell series connections made by making electrical breaks in the electrodes and forming electrical connections through holes in the mirror concentrators and the photon converters.

18. The apparatus of claim 1, wherein by separating the photon converters and the first electrodes with thin films over an insulator film, electrical potential is maintained across the insulator film for providing electrical shunt fault elimination.

19. The apparatus of claim 18, wherein discreet electrical penetrations through a dielectric film enhance shunt fault elimination.

20. The apparatus of claim 1, wherein a point contact between the photon converters and exit apertures enhances performance of the photon converters.

21. The apparatus of claim 1, wherein contact with the back surfaces is small compared to the photon conversion material to enhance the performance of the photon conversion means.

22. The apparatus of claim 1, wherein contact with the back surface is larger than contact with the front surface for enhancing performance of the photon converters.

23. The apparatus of claim 1, wherein the back surfaces are coated with a high emissivity material.

24. The apparatus of claim 1, wherein the mirror concentrators are filled with a refractive material.

25. The apparatus of claim 1, further comprising lenses coupled with the mirror concentrators.

26. The apparatus of claim 1, wherein the mirror concentrators are arranged in an abutted relationship to form a continuous surface of parallel mirror concentrators.

27. The apparatus of claim 1, wherein the photon converters are preferentially deposited onto the exit apertures of the mirror concentrators.

28. The apparatus of claim 27, wherein the photon converters are preferentially deposited onto the exit apertures of the mirror concentrators by using properties associated with the mirror geometry of holes, cones or ridges, shadowing, electric field concentration, cooler or hotter under irradiation, fluid filtration, and aperture geometry.

29. The apparatus of claim 1, wherein the photon converters are annealed, doped or chemically changed while located on the exit apertures of the mirror concentrators.

30. The apparatus of claim 1, wherein the exit aperture has a dimension less than 2 mm.

31. The apparatus of claim 1, wherein a dimension of the mirror optics and converter is less than 1 cm.

32. A method of increasing the performance of optically thin photovoltaic cells by placing an array of reflective concentrating mirrors with exit apertures having dimensions smaller than dimensions of front apertures, within close proximity of a front surface of the optically thin photovoltaic cells and placing a reflective layer on a back surface of the cells, wherein the array of mirrors is a plurality of mirrors arranged in an abutted relationship to form a continuous surface of parallel mirrors, wherein a transparent dielectric material is provided in a space between backs of the array of mirrors and the optically thin photovoltaic cells, thereby enabling light to couple to the optically thin photovoltaic cells placed within the space between the backs of the concentrating mirrors and a back reflector.

33. The method of claim 32, further comprising filling with a refractive material a space between the array of mirrors and the photovoltaic cells.

34. The method of claim 32, further comprising an assembly having the mirrors and cells attached to a rigid substrate and the attached mirrors and cells being encapsulated in a clear material.

35. The method of claim 32, wherein the exit dimensions are smaller than 2 mm.

36. A method of forming a photovoltaic concentrator, comprising forming miniature concave mirrors having large inlets and small outlets, positioning semiconductors at the small outlets, and connecting first and second electrodes to the semiconductors, wherein the forming of small mirrors comprises forming parallel damage tracks perpendicularly through a dielectric substrate, etching the substrate and the damage tracks from the top surface, depositing an insulator film on the etched substrate, removing the substrate from the insulator film, depositing a metal reflector film on the insulator film and thereby forming the concave mirrors having large upper ends and small bottom ends.

37. The method of claim 36, further including the steps of placing an etch barrier on the bottom surface of the substrate, removing the barrier, and depositing a semiconductor film on the insulator film near the outlets and in the outlets of the mirrors in contact with the metal reflector film.

38. The method of claim 37, further comprising depositing a dopant material on the semiconductor film, and depositing a back electrode on the dopant material and on the insulator film.

39. Photovoltaic cell apparatus, comprising an array of concave mirrors with large receiving ends and small open outlet ends having a reflecting layer connecting mirrors in the array and an insulator layer beneath the reflective layer.

40. The apparatus of claim 39, further comprising semiconductors filling the small open ends and partially surrounding the insulator layer near the small ends, a back electrode covering the semiconductors and the insulator layer.

41. The apparatus of claim 40, further comprising a dopant material deposited on the semiconductor before the back electrode, and further comprising a blackening back film deposited on the back electrode.

\* \* \* \* \*